(12) United States Patent
Huang (10) Patent No.: US 8,944,347 B2
(45) Date of Patent: Feb. 3, 2015

(54) DEPOSITION NOZZLE AND APPARATUS FOR THIN FILM DEPOSITION PROCESS

(75) Inventor: Jen-Rong Huang, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 391 days.

(21) Appl. No.: 13/495,889

(22) Filed: Jun. 13, 2012

(65) Prior Publication Data

US 2013/0001330 A1 Jan. 3, 2013

(30) Foreign Application Priority Data

Jul. 1, 2011 (TW) .............................. 100123273 A (51) Int. Cl.
*B05B 1/28* (2006.01)
*C23C 16/455* (2006.01)
*C23C 16/458* (2006.01)
*C23C 16/48* (2006.01)

(52) U.S. Cl.
CPC ..... *C23C 16/45551* (2013.01); *C23C 16/45574* (2013.01); *C23C 16/4584* (2013.01); *C23C 16/482* (2013.01)
USPC ........................................... 239/291; 239/301

(58) Field of Classification Search
CPC ............................ B05B 3/1092; B05B 5/0426
USPC .................. 239/290, 291, 295, 301, 240, 246
See application file for complete search history.

(56) References Cited

U.S. PATENT DOCUMENTS

| | | | | |
|---|---|---|---|---|
| 3,984,054 A | * | 10/1976 | Frochaux | 239/424 |
| 4,842,206 A | * | 6/1989 | Kawasaki et al. | 242/475.9 |
| 6,042,652 A | | 3/2000 | Hyun et al. | |
| 6,685,106 B1 | * | 2/2004 | van der Steur | 239/296 |
| 6,932,871 B2 | | 8/2005 | Chang et al. | |
| 7,153,542 B2 | | 12/2006 | Nguyen et al. | |
| 2002/0084352 A1 | | 7/2002 | Chen | |
| 2003/0013320 A1 | | 1/2003 | Kim et al. | |

(Continued)

FOREIGN PATENT DOCUMENTS

| | | |
|---|---|---|
| CN | 101533764 A | 9/2009 |
| EP | 2249379 A2 | 11/2010 |

(Continued)

OTHER PUBLICATIONS

Taiwan Patent Office, Notice of Allowance issued on Oct. 2, 2013, Taiwan.

(Continued)

*Primary Examiner* — Davis Hwu
(74) *Attorney, Agent, or Firm* — Rabin & Berdo, P.C.

(57) ABSTRACT

A deposition nozzle and a deposition apparatus include a nozzle body, a precursor passageway formed at a central region of the nozzle body for a precursor gas to be sprayed on the substrate such that the precursor gas reacts with a surface of the substrate, an extraction passageway formed in the nozzle body and located at a peripheral side of the precursor passageway, and extracting residues after the precursor gas reacts with the surface of the substrate, and an air curtain passageway formed in the nozzle body and located at a peripheral side of the extraction passageway for isolating gas to be sprayed on the substrate so as to form a closed gas flow field enclosing a process reaction region between a substrate carrier and the deposition nozzle such that the residues after the precursor gas reacts with the surface of the substrate do not leak.

19 Claims, 5 Drawing Sheets

(56) References Cited

U.S. PATENT DOCUMENTS

| | | | |
|---|---|---|---|
| 2003/0164408 A1* | 9/2003 | Schmon | 239/291 |
| 2004/0067641 A1 | 4/2004 | Yudovsky | |
| 2006/0196418 A1 | 9/2006 | Lindfors et al. | |
| 2007/0259110 A1 | 11/2007 | Mahajani et al. | |
| 2009/0017637 A1 | 1/2009 | Huang et al. | |
| 2009/0156015 A1 | 6/2009 | Park et al. | |
| 2009/0304924 A1 | 12/2009 | Gadgil | |
| 2010/0028122 A1 | 2/2010 | Lindfors et al. | |
| 2010/0173495 A1 | 7/2010 | Thakur et al. | |

FOREIGN PATENT DOCUMENTS

| | | |
|---|---|---|
| JP | 3089684 B2 | 9/2000 |
| JP | 2004193173 A | 7/2004 |
| JP | 2007084924 A | 4/2007 |
| JP | 200997042 A | 5/2009 |
| TW | M290304 U | 5/2006 |

OTHER PUBLICATIONS

Granneman et al., "Batch ALD: Characteristics, comparison with single safer ALD, and examples", Surface and Coatings Technology, vol. 201, Issues 22-23, pp. 8899-8907, Sep. 25, 2007.

Hodson et al., "Using ALD for improved efficiency of crystallines silicon solar cells", Photovoltaic World, pp. 17-21, Sep./Oct. 2009.

Leskela et al., "Atomic layer deposition (ALD): from precursors to thin film structures", Thin Solid Films, vol. 409, pp. 138-146, 2002.

China Patent Office, Office Action, Patent Application Serial No. 201110217655.0, Jan. 6, 2014, China.

* cited by examiner

DEPOSITION NOZZLE AND APPARATUS FOR THIN FILM DEPOSITION PROCESS

CROSS-REFERENCE TO RELATED APPLICATIONS

This application claims priority to Taiwanese Patent Application No. 100123273, filed on Jul. 1, 2011.

BACKGROUND

1. Technical Field

The present disclosure relates to deposition nozzles and deposition apparatuses, and, more particularly, to a deposition nozzle which forms a closed gas flow field on a substrate between a substrate carrier and a deposition apparatus to which the deposition nozzle is applied.

2. Description of Related Art

The principle of atomic layer deposition technology is that process gas is rendered to perform chemical deposition reaction with a material surface so as to deposit a film with a thickness of atomic level on the material surface.

Although the technology disclosed in the prior art can achieve an object of mass production, not only the amount of required precursor is quite large but also the extraction procedure needs to spend a lot of time since the reaction chamber is usually quite large. Therefore, it is a major reason why a company can't cost down.

Another technique disclosed in the prior art exists a problem of not being capable of completely removing the remaining precursor and by-products. Specifically, it uses different work stations to deposit first and second precursors on wafers, respectively, but merely provides a rough barrier during spraying and depositing the precursors. Therefore, the spread of the precursor can not be blocked sufficiently such that the precursors sprayed by different work stations would mix with each other. Provided that the first precursor sprayed by a previous work station exist in subsequent work station for spraying the second precursor, the by-products generated by the first precursor and the second precursor due to chemical reaction will result in all kinds of deposition defects and the uniformity and quality of deposition will be adversely affected.

Hence, how to overcome the above mentioned issues has substantially become a problem to be solved in the art.

SUMMARY

The present disclosure provides a deposition nozzle and a deposition device which rapidly and uniformly accomplishes a deposition process while preventing precursors to react with each other and then generate deposition defects.

The present disclosure provides a deposition nozzle, for performing deposition on a substrate, which comprises: a nozzle body; a precursor passageway formed at a central region of the nozzle body for a precursor gas to be sprayed on the substrate such that the precursor gas reacts with a surface of the substrate; an extraction passageway formed at a peripheral side of the precursor passageway of the nozzle body, for extracting residues after the precursor gas reacts with the surface of the substrate; and an air curtain passageway formed at a peripheral side of the extraction passageway of the nozzle body, for isolating gas to be sprayed on the substrate so as to form a closed gas flow field enclosing a process reaction region on the substrate between the substrate carrier and the deposition nozzle such that the residues after the precursor gas reacts with the surface of the substrate will not leak.

The present disclosure further provides a deposition apparatus, for performing deposition on a substrate, comprising: a substrate carrier, for carrying and rotating a substrate to be deposited; and a deposition nozzle, corresponding to the substrate on the substrate carrier while being disposed above the substrate, comprising: a nozzle body; a precursor passageway, formed at a central region of the nozzle body, for a precursor gas flow to be sprayed via the precursor passageway on a substrate such that the precursor gas reacts with a surface of the substrate; an extraction passageway, formed at a peripheral side of the precursor passageway of the nozzle body, for extracting residues after the precursor gas reacts with the surface of the substrate; and an air curtain passageway formed at a peripheral side of the extraction passageway of the nozzle body, for isolating gas to be sprayed via the air curtain passageway on the substrate and a substrate carrier that carries the substrate so as to form a closed gas flow field enclosing a process reaction region on the substrate between the substrate carrier and the deposition nozzle.

DETAILED DESCRIPTION

Figure 1A:
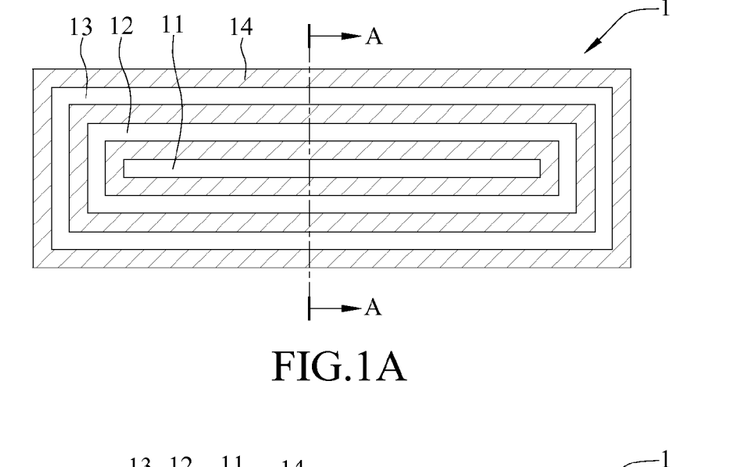
FIG. 1A is a schematically top view of the structure of a deposition nozzle according to the present disclosure.
Figure 1B:
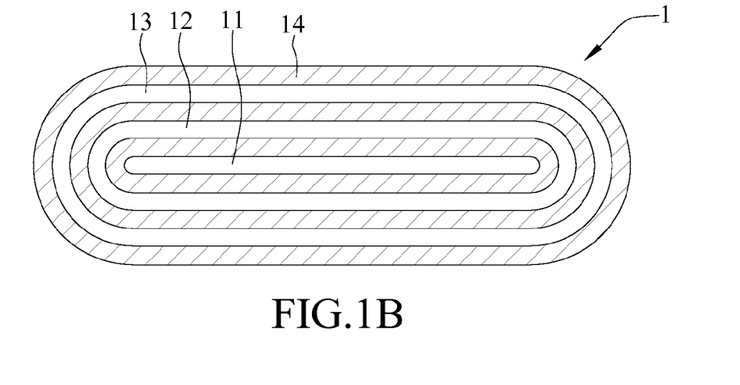
FIG. 1B is another schematically top view of the structure of the deposition nozzle according to the present disclosure.
Figure 1C:
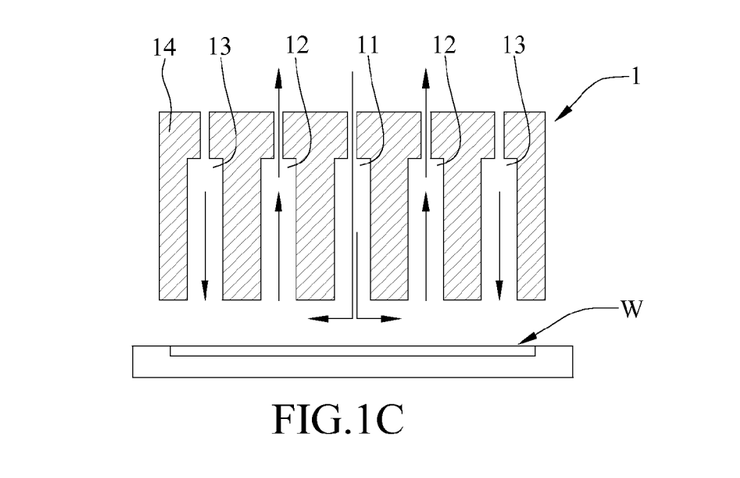
FIG. 1C is a structural schematic diagram viewed along line segment A-A of FIG. 1A.

The structural description of a deposition nozzle according to the present disclosure are depicted with reference to FIGS. 1A-1C, wherein FIG. 1A is a schematically top view of the structure of the deposition nozzle 1 according to the present disclosure, FIG. 1B is another embodiment of the deposition nozzle 1 of FIG. 1A, and FIG. 1C is a schematically cross-sectional view taken along the line segment A-A.

The description herein is mentioned that, the deposition nozzle of the present disclosure can be applied in an atomic layer epitaxy process (ALE/ALD) so as to accomplish a deposition procedure on a substrate. Said substrate can be soft or hard, for instance, a glass substrate or a wafer of all kinds of shape.

As illustrated, the deposition nozzle 1 includes a nozzle body 14, a precursor passageway 11, an extraction passageway 12, and an air curtain passageway 13.

The precursor passageway 11 is formed at a central region of the nozzle body 14, for a precursor gas to be sprayed on the substrate W such that the precursor gas reacts with a surface of the substrate W. The precursor gas may be used in the atomic layer epitaxy process.

The extraction passageway 12, in this embodiment, is a closed type passageway and is formed at a peripheral side of the precursor passageway 11 of the nozzle body 14, for extracting residues from the reaction after the precursor gas sprayed from the precursor passageway 11 accomplishes a chemical deposition on the surface of the substrate W.

The air curtain passageway 13, in this embodiment, is a closed type passageway and is formed at a peripheral side of the extraction passageway 12 of the nozzle body 14, for spraying isolating gas, such as nitrogen, to surfaces of the substrate W and a substrate carrier W for carrying the substrate, so as to form a closed flow field for enclosing a process reaction region on the substrate W between the substrate carrier W and the deposition nozzle 1 by the sprayed isolating gas. Consequently, the precursor gas sprayed from the precursor passageway 11 and the residues generated after the precursor gas accomplishes the chemical deposition on the substrate W can be prevented form occurrence.

Figure 2A:
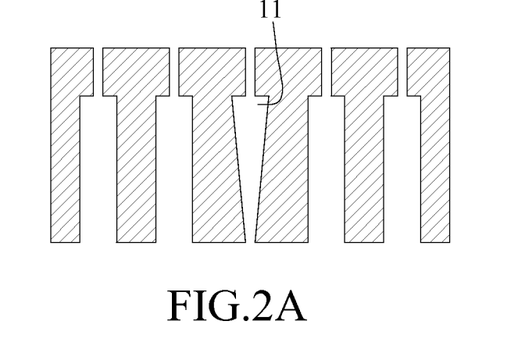
FIG. 2A is another structural schematic diagram of the deposition nozzle illustrated in FIG. 1C.
Figure 2B:
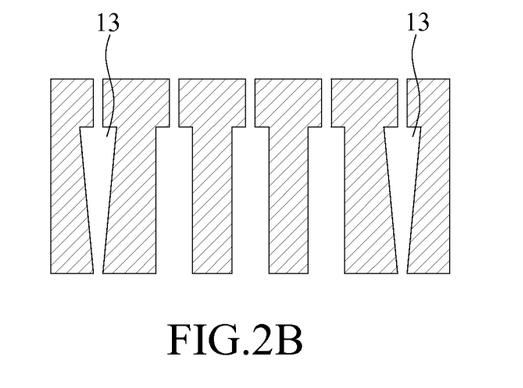
FIG. 2B is a further structural schematic diagram of the deposition nozzle illustrated in FIG. 1C.
Figure 2C:
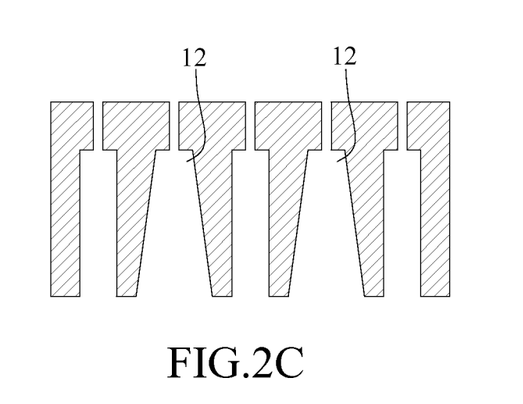
FIG. 2C is a further structural schematic diagram of the deposition nozzle illustrated in FIG. 1C.

In the embodiment, the opening shape of the precursor passageway 11, the extraction passageway 12 and the air curtain passageway 13 can be correspondingly regulated. For example, as illustrated in FIG. 2A, an opening end of the precursor passageway 11 can be of a gradually decreasing shape so as to more rapidly spray the precursor gas on the substrate W. Further as illustrated in FIG. 2B, an opening end of the air curtain passageway 13 can also be of a gradually decreasing shape so as to more rapidly spray the isolating gas on the substrate W. Also as illustrated in FIG. 2C, an opening end of the extraction passageway 12 can also be of a gradually increasing shape so as to provide better extraction effects. The extraction passageway 12 can, in addition to extract residues after the precursor gas reacts with the substrate W, moderately draw the isolating gas sprayed from the air curtain passageway 13.

In addition, the deposition nozzle 1 can be provided with a precursor supply source, a suction pump device and a gas supply source for an air curtain. Specifically, the precursor supply source is communicated with the precursor passageway 11 so as to provide the precursor gas to the precursor passageway 11. The suction pump device is communicated with the extraction passageway 12, for providing extracting power so as to extract the precursor gas sprayed from the precursor passageway 11 without reacting with the substrate W from the extraction passageway 12 and the residues generated after the precursor gas reacts with the substrate W. The gas supply source for an air curtain is communicated with the air curtain passageway 13 so as to provide gas for forming an air curtain to the air curtain passageway 13.

Figure 3A:
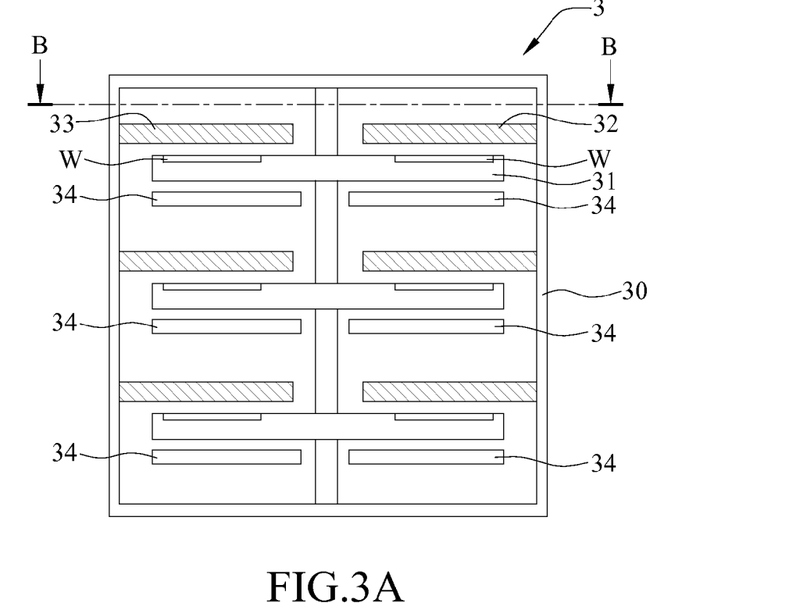
FIG. 3A is a structural schematic diagram of a deposition apparatus of the present disclosure.
Figure 3B:
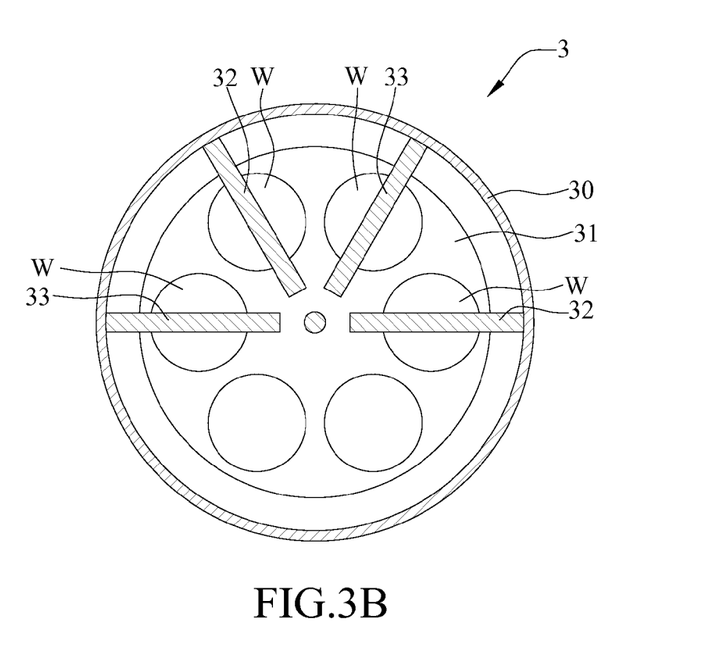
FIG. 3B is a structural schematic diagram viewed along line segment B-B of FIG. 3A.

The structural description of a deposition apparatus according to the present disclosure, is depicted with reference to FIGS. 3A and 3B, wherein FIG. 3A is a structural schematic diagram of the deposition apparatus according to the present disclosure, and FIG. 3B is a structural schematic diagram viewed along line segment B-B of FIG. 3A. The deposition apparatus according to the present disclosure can be applied in an atomic layer epitaxy process so as to perform a deposition procedure on a substrate. The substrate can be soft or hard, for instance, a glass substrate or a wafer of all kinds of shape.

As illustrated, the deposition apparatus 3 can be provided with a reaction chamber 30, a substrate carrier 31, a first deposition nozzle 32 and a second deposition nozzle 33. It should be noted that structural features of the first deposition nozzle 32 and second deposition nozzle 33 may be referred to the deposition nozzle 1.

The substrate carrier 31 is disposed in the reaction chamber 30, for carrying a plurality of substrates W to be deposited, and can perform horizontal rotation with constant speed or inconstant speed in an atomic layer epitaxy process. In the embodiment, the substrate carrier 31 can be designed as an aspect of being driven by a shift while performing horizontal rotation.

The first deposition nozzle 32, disposed at an inner wall of the reaction chamber 30 and above the substrate carrier 31, has a first nozzle body; a first precursor passageway (referring to the precursor passageway 11 of the deposition nozzle 1) formed at a central region of the first nozzle body, for spraying a first precursor gas of the atomic layer epitaxy process on the substrate W under the first deposition nozzle 32 such that the first precursor gas reacts with a surface of the substrate W; a first extraction passageway (referring to the extraction passageway 12 of the deposition nozzle 1) formed in the first nozzle body and located at a peripheral side of the first precursor passageway, for extracting residues after the first precursor gas reacts with the surface of the substrate W under the first deposition nozzle 32; and an first air curtain passageway (referring to the air curtain passageway 13 of the deposition nozzle 1) formed in the first nozzle body 14 and located at a peripheral side of the first extraction passageway, for spraying first isolating gas, such as nitrogen, to the substrate carrier so as to form a closed flow field enclosing a process reaction region between the substrate carrier under the first deposition nozzle 32 and the first deposition nozzle 32.

A second deposition nozzle 33, disposed at an inner wall of the reaction chamber 30 and above the substrate carrier 31 is located at a peripheral side of the first deposition nozzle 32 and has a second nozzle body; a second precursor passageway (referring to the precursor passageway 11 of the deposition nozzle 1) formed at a central region of the second nozzle body, for spraying a second precursor gas of the atomic layer epitaxy process on the substrate W under the second deposition nozzle 33 such that the second precursor gas reacts with a surface of the substrate W; a second extraction passageway (referring to the extraction passageway 12 of the deposition nozzle 1)formed in the second nozzle body and located at a peripheral side of the second precursor passageway, for extracting residues after the second precursor gas reacts with the surface of the substrate W under the second deposition nozzle 33; and an second air curtain passageway (referring to the air curtain passageway 13 of the deposition nozzle 1), formed in the second nozzle body and located at a peripheral side of the second extraction passageway, for spraying second isolating gas, such as nitrogen, to the substrate carrier so as to form a closed flow field enclosing a process reaction region between the substrate carrier under the second deposition nozzle 33 and the second deposition nozzle 33.

While performing the description process, the substrate carrier 31 can perform horizontal rotation with constant speed or inconstant speed during the deposition process such that the substrate W passes through underneath the first deposition nozzle 32 first. Accordingly, a first layer of film is formed by the first precursor gas sprayed from the first deposition nozzle 32 via performing a first step of chemical vapor deposition on the surface of the substrate W. Then, the substrate W formed with the first layer of film is further moved underneath the second deposition nozzle 33 such that a second layer of film is formed by the second precursor gas sprayed from the second deposition nozzle 33 via performing a second step of chemical vapor deposition on the surface of the substrate W.

During the deposition process, a state of maintaining at constant pressure or being slightly lower than the constant pressure in the reaction chamber 30 can be achieved by the continuous spraying and extraction of the first deposition nozzle 32 and the second deposition nozzle 33.

It is to be noticed that the deposition apparatus 3 can further include a heating device 34. The heating device 34 is disposed in the reaction chamber 30 and located under the substrate carrier 31 and is for heating the substrate W carried by the substrate carrier 31. The heating device 34 can be a non-contact heater of radio frequency (RF) or infrared ray (IF) and has a thermal couple and a thermal sensor therein so as to regulate and monitor temperature.

Figure 3C:
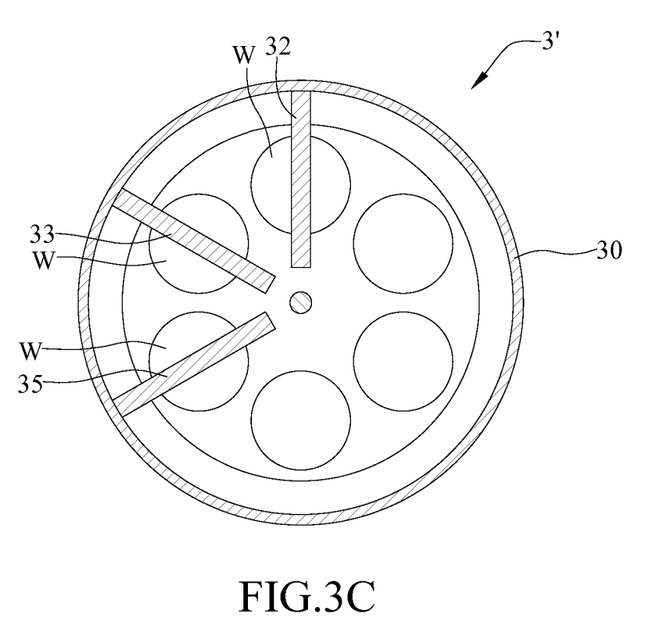
FIG. 3C is another structural schematic diagram of the deposition apparatus illustrated in FIG. 3B.

Further, the deposition apparatus is provided with, in addition to the first deposition nozzle 32 and the second deposition nozzle 33, an isolating gas nozzle 35. Referring to a deposition apparatus 3' of FIG. 3C, the difference between the deposition apparatus 3' and the deposition apparatus 3 shown in FIGS. 3A and 3B is that the deposition apparatus 3' further comprises the isolating gas nozzle 35. The isolating gas nozzle 35 is disposed at a side of the second deposition nozzle 33 and for a third isolating gas, such as nitrogen, to be sprayed on a substrate carrier under the isolating gas nozzle 35. Specifically, the isolating gas nozzle 35 can provide further isolation effects after the substrate W passes through the first deposition nozzle 32 and the second deposition nozzle 33. The isolating gas nozzle 35 can also be designed in a form of the deposition nozzle 1 while being set not to spray any precursor gas. Of course, in the embodiment, the deposition nozzles 32, 33 can be provided with said precursor supply source, suction pump device and gas supply source for forming an air curtain.

Figure 4A:
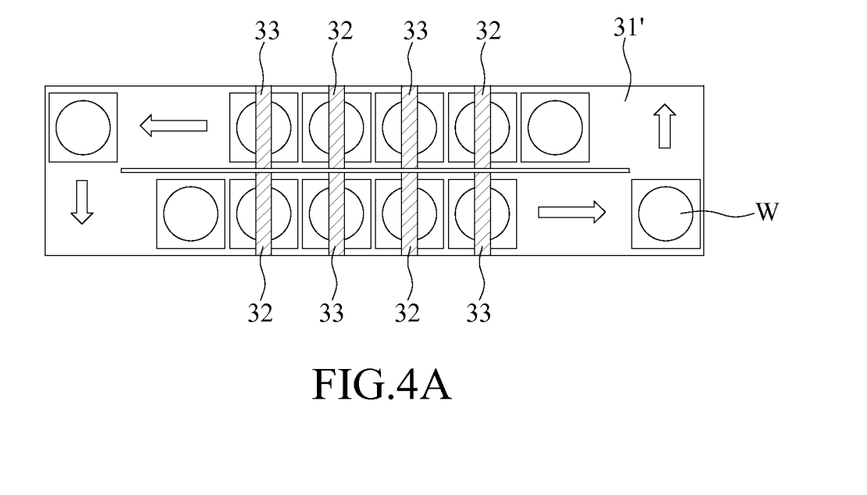
FIG. 4A is another structural schematic diagram of a substrate carrier of the present disclosure.
Figure 4B:
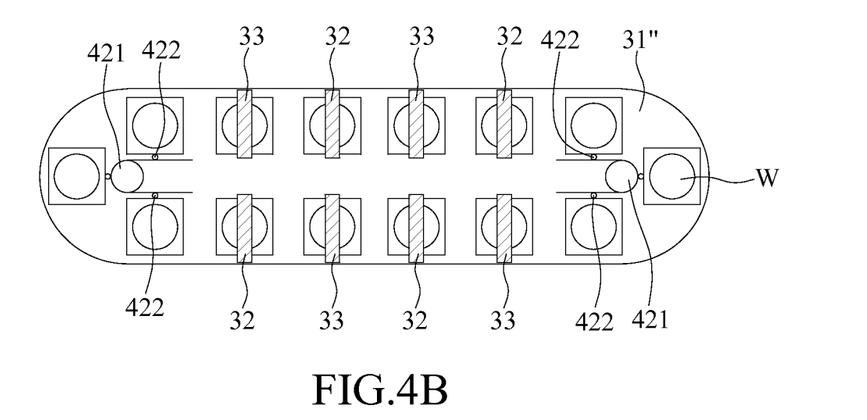
FIG. 4B is a further structural schematic diagram of the substrate carrier according to the present disclosure.

Also illustrated in FIGS. 4A and 4B, the substrate carrier of the deposition apparatus can be further designed as an aspect of circulation. Specifically, in the embodiment of FIG. 4A, the substrate carrier 31' is designed as a form of being driven by a conveyer to perform horizontal rotation. An acceleration device (not shown) can be coupled at two ends of the conveyer for accelerating moving circulation speed of the substrate W so as to prevent blocking situation during the deposition process. In the embodiment of FIG. 4B, the substrate carrier 31" is designed as a form of being driven by a chain sprocket 421 to perform horizontal rotation and designed to support the substrate in cooperation with a pin 422. In an actual implementation, the substrate carrier can further be designed with accurate roll-to-roll technology.

The abovementioned embodiments merely exemplarily illustrate the principles and its effects of the present disclosure instead of limiting the present disclosure. Any person skilled in the art can modify and change the abovementioned embodiments without violating the spirit and scope of the present disclosure. Therefore, the scope of the claimed disclosure of the present disclosure is as the appended claims later.

What is claimed is:

1. A deposition nozzle, comprising:
a nozzle body;
a precursor passageway formed at a central region of the nozzle body, for a precursor gas flow to be sprayed via the precursor passageway on a substrate such that the precursor gas reacts with a surface of the substrate;
an extraction passageway formed at a peripheral side of the precursor passageway of the nozzle body, for extracting residues after the precursor gas reacts with the surface of the substrate; and
an air curtain passageway formed at a peripheral side of the extraction passageway of the nozzle body, for isolating gas to be sprayed via the air curtain passageway on the substrate and a substrate carrier that carries the substrate so as to form a closed gas flow field enclosing a process reaction region on the substrate between the substrate carrier and the deposition nozzle.

2. The deposition nozzle of claim 1, wherein the isolating gas is nitrogen.

3. The deposition nozzle of claim 1, wherein the substrate is a wafer or a glass substrate.

4. The deposition nozzle of claim 1, wherein the air curtain passageway has an opening end formed in gradually decreased shape.

5. The deposition nozzle of claim 1, wherein the extraction passageway has an opening end formed in a gradually increased shape.

6. The deposition nozzle of claim 1, wherein the precursor passageway has an opening end formed in a gradually decreased shape.

7. The deposition nozzle of claim 1, wherein the extraction passageway further extracts the isolating gas sprayed from the air curtain passageway.

8. The deposition nozzle of claim 1, wherein the extraction passageway and the air curtain passageway are closed type passageways.

9. A deposition apparatus, comprising:
a substrate carrier for carrying and rotating a substrate to be deposited; and
a deposition nozzle corresponding to the substrate carried and disposed on the substrate carrier while being disposed above the substrate, the deposition nozzle comprising:
a nozzle body;
a precursor passageway formed at a central region of the nozzle body, for a precursor gas flow to be sprayed via the precursor passageway on a substrate such that the precursor gas reacts with a surface of the substrate;
an extraction passageway formed at a peripheral side of the precursor passageway of the nozzle body, for extracting residues after the precursor gas reacts with the surface of the substrate; and
an air curtain passageway formed at a peripheral side of the extraction passageway of the nozzle body, for isolating gas to be sprayed via the air curtain passageway on the substrate and a substrate carrier that carries the substrate so as to form a closed gas flow field enclosing a process reaction region on the substrate between the substrate carrier and the deposition nozzle.

10. The deposition apparatus of claim 9, further comprising at least another one of the deposition nozzle.

11. The deposition apparatus of claim 9, further comprising a heating device disposed under the substrate carrier.

12. The deposition apparatus of claim 11, wherein the heating device is a non-contact heater of radio frequency or infrared ray.

13. The deposition apparatus of claim 11, wherein the heating device comprises a thermal couple and a thermal sensor.

14. The deposition apparatus of claim 9, wherein the substrate is a shaft type carrier or a circulation type carrier.

15. The deposition apparatus of claim 14, wherein the circulation type carrier is of a structure circulated by a conveyer or a chain sprocket.

16. The deposition apparatus of claim 9, wherein a side of the deposition nozzle is selectively provided with an isolating gas nozzle for spraying isolating gas to the substrate.

17. The deposition apparatus of claim 16, wherein the isolating gas is nitrogen.

18. The deposition apparatus of claim 9, wherein the substrate is a wafer or a glass substrate.

19. The deposition apparatus of claim 9, wherein the extraction passageway and the air curtain passageway are closed type passageways.

\* \* \* \* \*